(12) United States Patent
Kim et al.

(10) Patent No.: US 8,319,572 B2
(45) Date of Patent: Nov. 27, 2012

(54) ELECTROMAGNETIC BANDGAP STRUCTURE AND PRINTED CIRCUIT BOARD

(75) Inventors: Han Kim, Yongin-si (KR); Kang-Wook Bong, Seoul (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 507 days.

(21) Appl. No.: 12/568,324

(22) Filed: Sep. 28, 2009

(65) Prior Publication Data

US 2010/0134212 A1 Jun. 3, 2010

(30) Foreign Application Priority Data

Dec. 2, 2008 (KR) ........................ 10-2008-0120943

(51) Int. Cl.
*H04B 3/30* (2006.01)
(52) U.S. Cl. .......... 333/12; 333/167; 333/185; 333/202; 333/246
(58) Field of Classification Search .................... 333/12, 333/167, 185, 202, 212, 246
See application file for complete search history.

(56) References Cited

U.S. PATENT DOCUMENTS

| | | | |
|---|---|---|---|
| 6,483,045 B1 * | 11/2002 | Wang et al. | 174/264 |
| 6,943,650 B2 * | 9/2005 | Ramprasad et al. | 333/202 |
| 2005/0194168 A1 * | 9/2005 | Tonomura et al. | 174/35 R |
| 2007/0090398 A1 * | 4/2007 | McKinzie, III | 257/192 |

* cited by examiner

*Primary Examiner* — Robert Pascal
*Assistant Examiner* — Kimberly Glenn
(74) *Attorney, Agent, or Firm* — McDermott Will & Emery LLP

(57) ABSTRACT

An electromagnetic bandgap structure includes: first conductive plates, placed on a first planar surface; second conductive plates, placed on a second planar surface; a first conductive trace, electrically connecting any two adjacent first conductive plates with each other on the first planar surface, in which the two adjacent first conductive plates are in a first direction; a second conductive trace, electrically connecting any two adjacent second conductive plates with each other on the second planar surface, in which the two adjacent second conductive plates are in the first direction; a first stitching via, electrically connecting any two adjacent conductive portions lined up in a direction different from the first direction on the first planar surface with each other; and a second stitching via, electrically connecting any two adjacent conductive portions lined up in a direction different from the first direction on the second planar surface with each other.

20 Claims, 15 Drawing Sheets

ELECTROMAGNETIC BANDGAP STRUCTURE AND PRINTED CIRCUIT BOARD

CROSS-REFERENCE TO RELATED APPLICATIONS

This application claims the benefit of Korean Patent Application No. 10-2008-0120943, filed with the Korean Intellectual Property Office on Dec. 2, 2008, the disclosure of which is incorporated herein by reference in its entirety.

BACKGROUND

1. Technical Field

The present invention relates to an electromagnetic bandgap structure, more specifically to an electromagnetic bandgap structure and a printed circuit board having the same that prevent a signal ranging a predetermined frequency band from being transmitted.

2. Description of the Related Art

New electronic apparatuses and communication apparatuses are increasingly becoming smaller, thinner and lighter, reflecting today's emphasis on growing mobility.

These electronic and communication apparatuses have various complex electronic circuits (i.e. analog circuits and digital circuits) for performing their functions and operations. These electronic circuits typically carry out their functions by being implemented in a printed circuit board (PCB). The electronic circuits on the PCB commonly have different operation frequencies from one another.

The printed circuit board in which various electronic circuit boards are implemented often has a noise problem, caused by the transfer of an electromagnetic (EM) wave resulted from the operation frequency and its corresponding harmonics components of one electronic circuit to another electronic circuit. The transferred noise can be roughly classified into radiation noise and conduction noise.

The radiation noise can be easily prevented by covering a protective cap on the electronic circuit. However, preventing the conduction noise (refer to the reference numeral 150 of FIG. 1) is not as easy, because the conduction noise is transferred through a signal transfer path inside the board.

The noise problem will be described in more detail with reference to FIG. 1. FIG. 1 is a sectional view showing a printed circuit board including two electronic circuits having different operation frequencies. Although FIG. 1 shows a 4-layered printed circuit board 100, it shall be evident that the printed circuit board can be modified to have a 2, 6 or 8-layered structure.

As shown in FIG. 1, the printed circuit board 100 includes four metal layers 110-1, 110-2, 110-3 and 110-4 (hereinafter, collectively referred to as 110) and dielectric layers 120-1, 120-2 and 120-3 (hereinafter, collectively referred to as 120) interposed between metal layers 110. The top metal layer 110-1 of the printed circuit board 100 is implemented with two electronic circuits 130 and 140 having different operation frequencies (hereinafter, referred to as a first electronic circuit 130 and a second electronic circuit 140, respectively). Here, it is assumed that the two electronic circuits 130 and 140 are digital circuits.

Here, if it is assumed that the metal layer represented by the reference numeral 110-2 is a ground layer and the metal layer represented by the reference numeral 110-3 is a power layer, each ground pin of the first electronic circuit 130 and the second electronic circuit 140 is electrically connected to the metal layer represented by the reference numeral 110-2 and each power pin is electrically connected to the metal layer represented by the reference numeral 110-3. In the printed circuit board 100, every ground layer is also electrically connected to each other through vias. Similarly, every power layer is also electrically connected to each other through vias. As an example, a via 160 electrically connects the metal layers of the reference numerals 110-1, 110-3, and 110-4 as shown in FIG. 1.

At this time, if the first electronic circuit 130 and the second electronic circuit 140 have different operation frequencies, a conductive noise 150 caused by an operation frequency of the first electronic circuit 130 and its harmonics components is transferred to the second electronic circuit 140. This has a disadvantageous effect on the accurate function/operation of the second electronic circuit 140.

With the growing complexity of electronic apparatuses and higher operation frequencies of digital circuits, it is increasingly difficult to solve this conduction noise problem. Especially, the typical bypass capacitor method or decoupling capacitor method for solving the conductive noise problem is no longer adequate, as the electronic apparatuses use a higher frequency band.

Moreover, the aforementioned solutions are not adequate when several active devices and passive devices need to be implemented in a complex wiring board having various types of electronic circuits formed on the same board or in a narrow area such as a system in package (SiP) or when a high frequency band is required for the operation frequency, as in a network board.

Accordingly, an electromagnetic bandgap structure (EBG) is recently receiving attention as a scheme to solve the aforementioned conductive noise. This is for the purpose of blocking a signal ranging a certain frequency band by arranging the EBG having a certain structure in a printed circuit board, and the typical EBG has roughly two, namely a Mushroom type EBG(MT-EBG) and a Planar type EBG(PT-EBG).

A general form of the MT-EBG is illustrated in FIG. 2.

For example, the MT-EBG has the structure in which a plurality of EBG cells (refer to the reference numeral 230 of FIG. 2) having a mushroom form are interposed between two metal layers which function as a power layer and a ground layer. FIG. 2 shows only four EBG cells for the convenience of illustration.

With reference to FIG. 2, the MT-EBG 200 further forms a metal plate 231 between a first metal layer 210 and a second metal layer 220 that function as each one of the ground layer and the power layer, and has a form in which the mushroom type structures 230 connecting the first metal layer 210 and the metal plate 231 through a via 232 are repeatedly arranged. At this time, a first dielectric layer 215 is interposed between the first metal layer 210 and the metal plate 231, and a second dielectric layer 225 is interposed between the metal plate 231 and the second metal layer 220.

Such MT-EBG 200 performs the function as a sort of band stop filter by having the state of which a capacitance component formed by the second metal layer 220, the second dielectric layer 225 and the metal plate 231, and an inductance component formed by the via 232 penetrating the first dielectric layer 215 and connecting the first metal layer 210 and the metal plate 231, are connected in L-C series between the first metal layer 210 and the second layer 220.

However, the largest demerit of this structure is the increase of layers, because it needs at least 3 layers to implement the MT-EBG 200. In this case, not only the manufacturing cost of the PCB increases, but also the design freedom is limited.

On the one hand, PT-EBG is illustrated in FIG. 3.

PT-EBG has a structure in which a plurality of EBG cells (refer to the reference numeral 320-1 of FIG. 3) having a certain pattern are repeatedly arranged through any entire metal layer that functions as each one of the ground layer and the power layer. FIG. 3 also shows only four EBG cells for the convenience of illustration.

With reference to FIG. 3, PT-EBG 300 has a form in which any metal layer 310 and a plurality of metal plates 321-1, 321-2, 321-3 and 321-4, which are placed on another planar surface, are bridged to each other through a certain part of metal plates (the edge end of each metal plate in FIG. 3) by metal branches 322-1, 322-2, 322-3 and 322-4.

At this time, the metal plates 321-1, 321-2, 321-3, and 321-4 having a large size constitute the low impedance area and the metal branches having a small size constitute the high impedance area. Accordingly, PT-EBG performs the function as a band stop filter that can block a noise ranging a certain frequency band through the structure in which the low impedance area and the high impedance area are repeatedly formed in turn.

Although such PT-EBG structure has a merit that is enough to constitute the bandgap structure by using only two layers in contrast to the structure of MT-EBG, there is not only a difficulty in making cells smaller but also a design limit, which makes it hard to apply to various application products because it is formed in a lager area. This is because PT-EBG forms the EBG structure by not utilizing various parameters but using only two impedance components.

As described above, the EBG structures according to the conventional technology, such as the MT-EBG and the PT-EBG have a limit in adjusting each bandgap frequency band appropriate to the conditions and features that are required for various application products or lower a conductive noise below the intended noise level within a pertinent bandgap frequency band.

Accordingly, the research for the EBG structure being extensively applied to various application products for which the required bandgap frequency bands separately differ, not to mention solving the aforementioned conductive noise problem, is urgently needed.

SUMMARY

Accordingly, the present invention provides an electromagnetic bandgap structure and a printed circuit board having the same that can block a conductive noise of a certain frequency band.

The present invention also provides a printed circuit board that can solve a conductive noise problem through an electromagnetic bandgap structure having a certain structure in the printed circuit board without using a bypass capacitor or a decoupling capacitor.

In addition, the present invention provides an electromagnetic bandgap structure and a printed circuit board having the design flexibility and design freedom appropriate for the printed circuit board and being extensively applied to various application products (for example, an electronic apparatus (e.g. a mobile communication terminal) including an RF circuit and a digital circuit which are placed in the same board, SiP (System in Package), and network board, etc.) by the realization of various bandgap frequency band.

Other problems that the present invention solves will become more apparent through the following description.

An aspect of the present invention provides an electromagnetic bandgap structure that can block a noise of a certain frequency band.

In accordance with an embodiment of the present invention, an electromagnetic bandgap structure can include a plurality of first conductive plates, placed on a first planar surface, a plurality of second conductive plates, placed on a second planar surface, a first conductive trace, which electrically connects any two adjacent first conductive plates with each other on the first planar surface and in which the two adjacent first conductive plates are lined up in a first direction among the plurality of first conductive plates, a second conductive trace, which electrically connects any two adjacent second conductive plates with each other on the second planar surface and in which the two adjacent second conductive plates are lined up in the first direction among the plurality of second conductive plates. The electromagnetic bandgap structure can further include a first stitching via, which electrically connects any two adjacent conductive portions with each other and in which the two adjacent conductive portions are lined up in a direction that is different from the first direction on the first planar surface by having a part of the first stitching via pass through a planar surface that is different from the first planar surface. Here, the two adjacent conductive portions placed on the first planar surface can include at least one of the plurality of first conductive plates. Moreover, the electromagnetic bandgap structure can further include a second stitching via, which electrically connects any two adjacent conductive portions with each other and in which the two adjacent conductive portions are lined up in a direction that is different from the first direction on the second planar surface by having a part of the second stitching via pass through a planar surface that is different from the second planar surface. Here, the two adjacent conductive portions placed on the second planar surface can include at least one of the plurality of second conductive plates.

In an embodiment of the present invention, a dielectric layer can be interposed between the first conductive plates and the second conductive plates, and the planar surface through which the part of the first stitching via passes can be the second planar surface.

In an embodiment of the present invention, the first stitching via can include a first via, having an end part being connected to one of the two adjacent conductive portions placed on the first planar surface, a second via, having an end part being connected to the other of the two adjacent conductive portions placed on the first planar surface, and a connection pattern, having one end part being connected to the other end part of the first via and the other end part being connected to the other end part of the second via, in which the connection pattern is placed on the planar surface that is different from the first planar surface.

In an embodiment of the present invention, the other planar surface through which the part of the second stitching via passes can be the first planar surface.

In an embodiment of the present invention, the second stitching via can include a first via, having an end part being connected to one of the two adjacent conductive portions placed on the second planar surface, a second via, having an end part being connected to the other of the two adjacent conductive portions placed on the second planar surface, and a connection pattern, having one end part being connected to the other end part of the first via and the other end part being connected to the other end part of the second via, in which the connection pattern is placed on the planar surface that is different from the second planar surface.

In an embodiment of the present invention, the first conductive trace can be in a linear form or in a bended form having one or more bends, and the second conductive trace can be in a linear form or in a bended form having one or more bends.

In an embodiment of the present invention, the second conductive plates can be disposed on the second planar surface at an area that corresponds to an area on which the first conductive plates are disposed, and the first conductive plates and the second conductive plates can be disposed alternately on the first planar surface and the second planar surface, respectively, in such a way that the first conductive plates and the second conductive plates are not overlapped when viewed from the top.

In an embodiment of the present invention, the first stitching via or the second stitching via can connect the two conductive portions with each other in a direction that is perpendicular to the first direction.

Another aspect of the present invention provides a printed circuit board in which an electromagnetic bandgap structure is disposed in an area of a noise transferable path between a noise source point and a noise blocking destination point of the printed circuit board.

In accordance with an embodiment of the present invention, an electromagnetic bandgap structure can include a plurality of first conductive plates, placed on a first planar surface, a plurality of second conductive plates, placed on a second planar surface, a first conductive trace, which electrically connects any two adjacent first conductive plates with each other on the first planar surface and in which the two adjacent first conductive plates are lined up in a first direction among the plurality of first conductive plates, a second conductive trace, which electrically connects any two adjacent second conductive plates with each other on the second planar surface and in which the two adjacent second conductive plates are lined up in the first direction among the plurality of second conductive plates. The electromagnetic bandgap structure can further include a first stitching via, which electrically connects any two adjacent conductive portions with each other and in which the two adjacent conductive portions are lined up in a direction that is different from the first direction on the first planar surface by having a part of the first stitching via pass through a planar surface that is different from the first planar surface. Here, the two adjacent conductive portions placed on the first planar surface can include at least one of the plurality of first conductive plates. Moreover, the electromagnetic bandgap structure can further include a second stitching via, which electrically connects any two adjacent conductive portions with each other and in which the two adjacent conductive portions are lined up in a direction that is different from the first direction on the second planar surface by having a part of the second stitching via pass through a planar surface that is different from the second planar surface. Here, the two adjacent conductive portions placed on the second planar surface can include at least one of the plurality of second conductive plates.

In an embodiment of the present invention, at least one of the first conductive trace and the second conductive trace can be in a linear form or in a bended form having one or more bends.

In an embodiment of the present invention, the second conductive plates can be disposed on the second planar surface at an area that corresponds to an area on which the first conductive plates are disposed, and the first conductive plates and the second conductive plates can be disposed alternately on the first planar surface and the second planar surface, respectively, in such a way that the first conductive plates and the second conductive plates are not overlapped when viewed from the top.

In an embodiment of the present invention, the first conductive plates or the second conductive plates can be disposed toward in first direction in at least one line, and the first direction can be determined to be a direction crossing the noise transferable path.

In an embodiment of the present invention, the first stitching via or the second stitching via can connect the two conductive portions with each other in a direction that is perpendicular to the first direction.

In an embodiment of the present invention, the first conductive plates can be electrically connected to one of a ground layer and a power layer, and the second conductive plates can be electrically connected to the other of the ground layer and the power layer.

In an embodiment of the present invention, the first conductive plates can be electrically connected to one of a ground layer and a signal layer, and the second conductive plates can be electrically connected to the other of the ground layer and the signal layer.

In an embodiment of the present invention, the printed circuit board can further include a pair of conductive planes, which are separated by a portion in which the first conductive plates are disposed on the first planar surface, and the conductive planes and the first conductive plates adjacent to the conductive planes can be electrically connected to each other by the first stitching via. Here, the two conductive planes can correspond to the noise source point and the noise blocking destination point, respectively.

In an embodiment of the present invention, the printed circuit board can further include a pair of conductive planes, which are separated by a portion in which the second conductive plates are disposed on the second planar surface, and the conductive planes and the second conductive plates adjacent to the conductive planes can be electrically connected to each other by the second stitching via. Here, the two conductive planes can correspond to the noise source point and the noise blocking destination point, respectively.

In an embodiment of the present invention, if two electronic circuits having different operation frequencies are installed in the printed circuit board, the noise source point and the noise blocking destination point can correspond to one position and the other position, respectively, on the printed circuit board in which the two electric circuits are to be installed.

Additional aspects and advantages of the present invention will be set forth in part in the description which follows, and in part will be obvious from the description, or may be learned by practice of the invention.

DETAILED DESCRIPTION

Since there can be a variety of permutations and embodiments of the present invention, certain embodiments will be illustrated and described with reference to the accompanying drawings. This, however, is by no means to restrict the present invention to certain embodiments, and shall be construed as including all permutations, equivalents and substitutes covered by the spirit and scope of the present invention.

Throughout the description of the present invention, when describing a certain technology is determined to evade the point of the present invention, the pertinent detailed description will be omitted. Terms such as "first" and "second" are used only to distinguish one element from the other.

Hereinafter, some examples of an electromagnetic bandgap structure including a stitching via having a basic principle similar to a blocking noise principle in accordance with some embodiments of the present invention will be described with reference to FIG. 4A and FIG. 4B for easy understanding of the present invention before an electromagnetic bandgap structure and a printed circuit board having the same are described with reference to FIG. 6 through FIG. 9.

Although a metal layer, a metal plate and a metal trace are used throughout the description of an electromagnetic bandgap structure of the present invention, it shall be evidently understood by any person of ordinary skill in the art that any other conductive layers, plates and traces can be substituted for the metal layer, the metal plate and the metal trace.

Also, even though FIG. 4A, FIG. 6, FIG. 7, FIG. 8 and FIG. 9 show only two or three metal plates for the convenience of illustration, the electromagnetic bandgap structure can have a plurality of metal plates repeatedly arranged as its elements as shown in FIG. 5A through FIG. 5E.

An electromagnetic bandgap structure 400 shown in FIG. 4A can include a metal layer 410, a plurality of metal plates 430-1 and 430-2 (hereinafter, referred to as a first metal plate 430-1 and a second metal plate 430-2) spaced from the metal layer 410 and a stitching via 440. The electromagnetic bandgap structure 400 of FIG. 4A can have 2-layered planar structure including a first layer that can consist of the metal layer 410 and a second layer that can consist of the plurality of metal plates 430-1 and 430-2. A dielectric layer 420 can be interposed between the metal layer 410 and the plurality of metal plates 430-1 and 430-2.

Figure 4A:
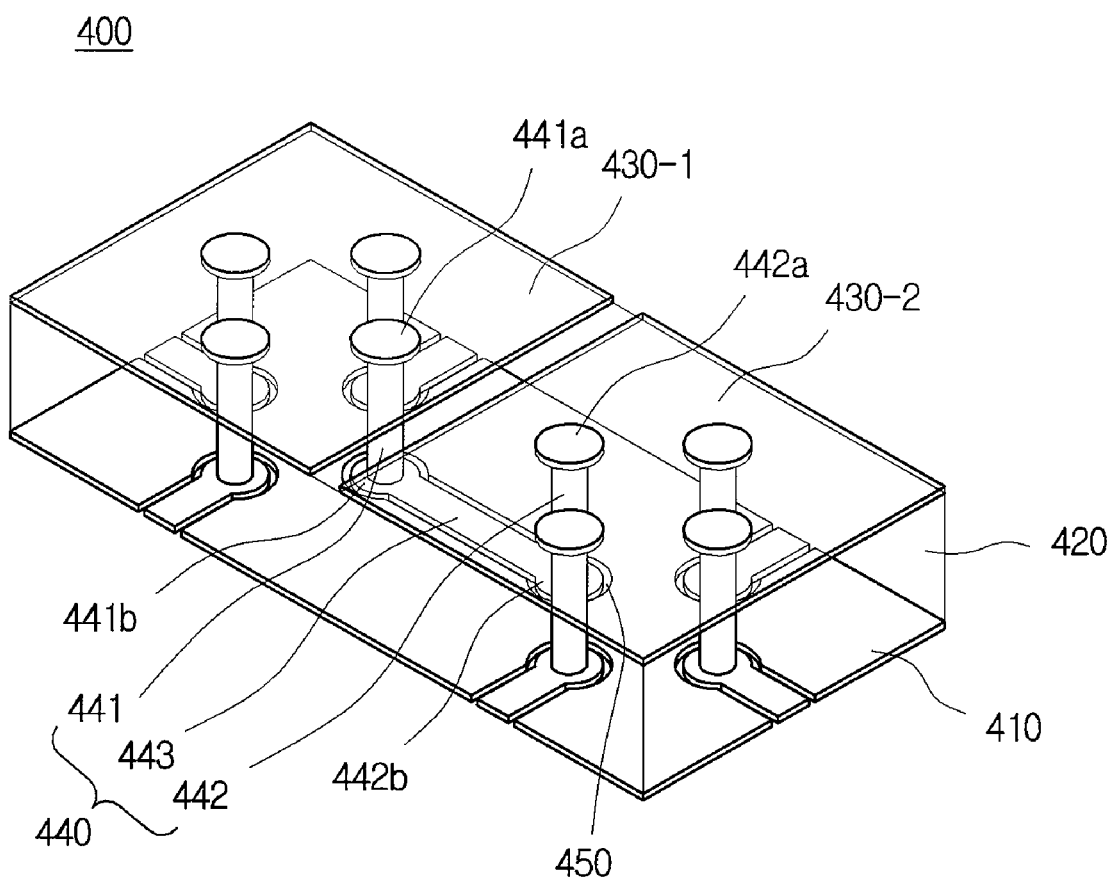
FIG. 4A is a 3-D perspective view showing an electromagnetic bandgap structure including a stitching via having a block principle similar to the present invention.

Here, FIG. 4A shows only elements constituting the electromagnetic bandgap structure (i.e. the only part constituting the 2-layered electromagnetic bandgap including the stitching via) for the convenience of illustration. Accordingly, the metal layer 410, and the plurality of metal plates 430-1 and 430-2 shown in FIG. 4A may be any two layers of a multi-layered printed circuit board. In other words, it shall be evident that there can be at least one additional metal layer below the metal layer 410, above the metal plates 430-1 and 430-2 and/or between the metal layer 410 and the metal plates 430-1 and 430-2. Similarly, this can be applied to the present invention shown in FIG. 6 and FIG. 8.

In addition, the electromagnetic bandgap structure 400 shown in FIG. 4A (the same can be applied to the present invention shown in FIG. 6 and FIG. 8) can be placed between any two metal layers separately constituting the power layer and the ground layer in order to block a conductive noise. Since the conductive noise problem is not limited to the space between the power layer and the ground layer, the electromagnetic bandgap structure shown in FIG. 4A can be placed between any two ground layers or power layers placed on different layers from each other in a multi-layered printed circuit board.

Accordingly, the metal layer 410 may be any one metal layer for transferring an electric signal in a printed circuit board. The metal layer 410, for example, can be any metal layer functioning as the power layer or the ground layer, or any metal layer functioning as a signal layer constituting a signal line.

The metal layer 410 can be placed on a planar surface different from the planar surface in which the plurality of metal plates are placed and electrically separated from the plurality of metal plates. In other words, the metal layer 410 can form a layer that is different from the plurality of metal plates 430-1 and 430-2 with regard to electrical signals in the printed circuit board. For example, if the metal layer 410 is the power layer, the metal plates can be electrically connected to the ground layer. If the metal layer 410 is the ground layer, the metal plates can be electrically connected to the power layer. Alternatively, if the metal layer 410 is the signal layer, the metal plates can be electrically connected to the ground layer. If the metal layer 410 is the ground layer, the metal plates can be electrically connected to the signal layer. Similarly, this can be applied to FIG. 6 and FIG. 8.

The plurality of metal plates 430-1 and 430-2 can be placed on a planar surface above the metal layer 410. Any two metal plates can be electrically connected to each other through a stitching via. As such, each stitching via electrically connecting any two metal plates to each other can electrically connect every metal plate as one circuit.

Here, FIG. 4A shows the form (i.e. the form of FIG. 5A) that a metal plate and its adjacent metal plates can be electrically connected to each other through one stitching via each, and as a result, every metal plate can be electrically connected to each other. However, as long all metal plates can be formed as a closed loop by being electrically connected to each other, it can be possible to use any method of connecting the metal plates to each other through the stitching via.

Figure 5A:
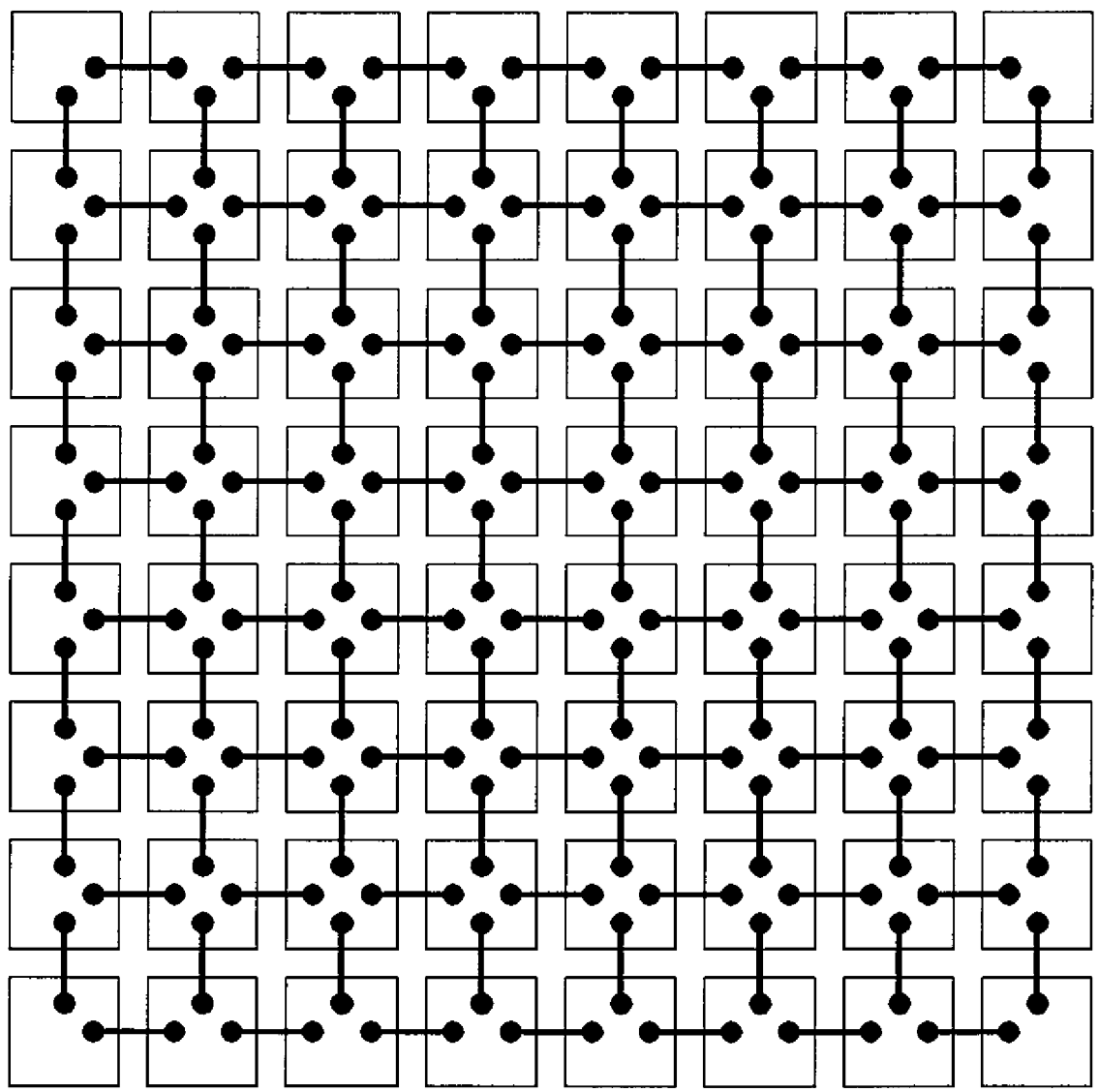
FIG. 5A is a plan view showing a configuration of an electromagnetic bandgap structure including a stitching via having a rectangular metal plate.
Figure 5B:
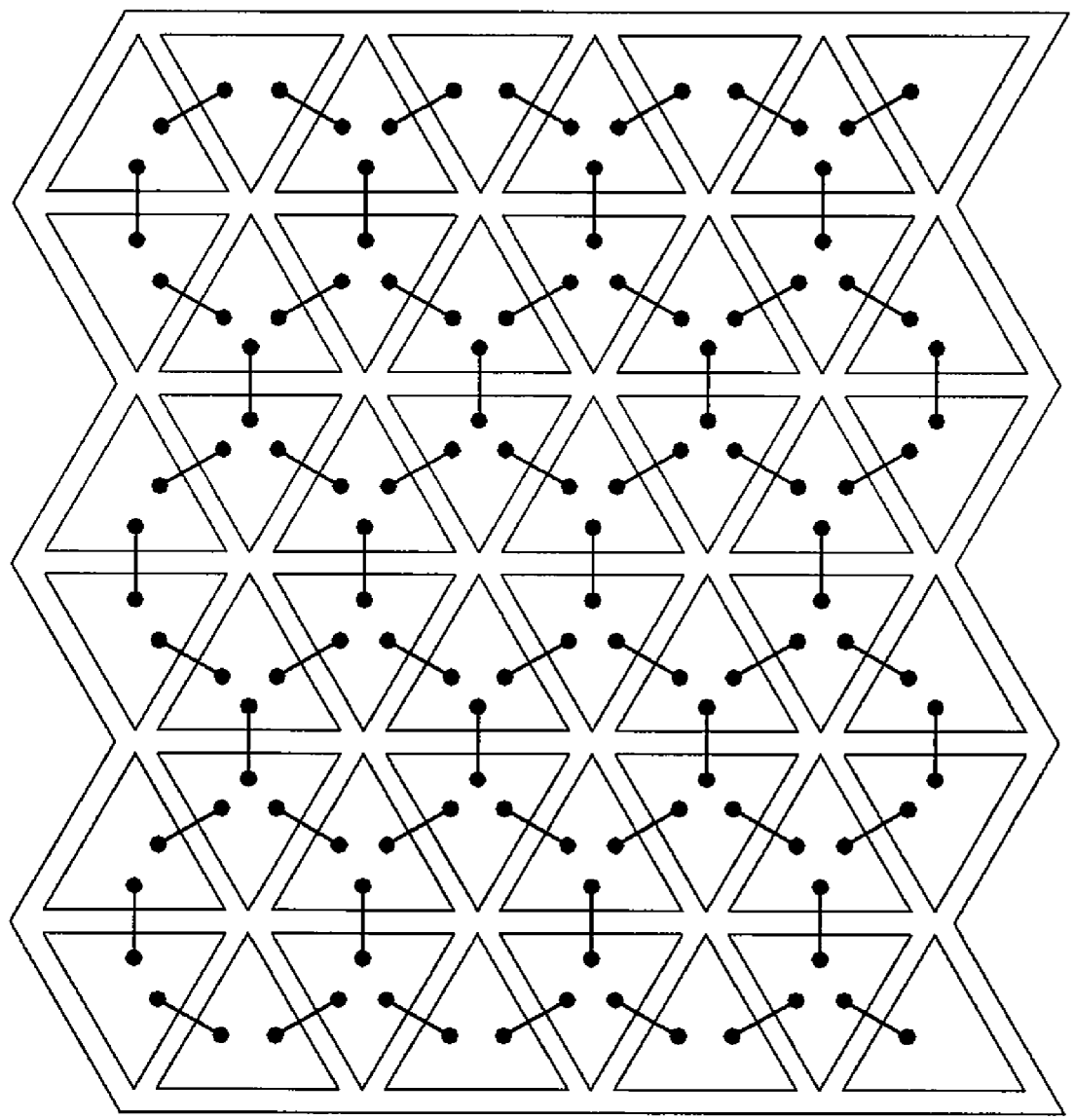
FIG. 5B is a plan view showing a configuration of an electromagnetic bandgap structure including a stitching via having a triangular metal plate.
Figure 5C:
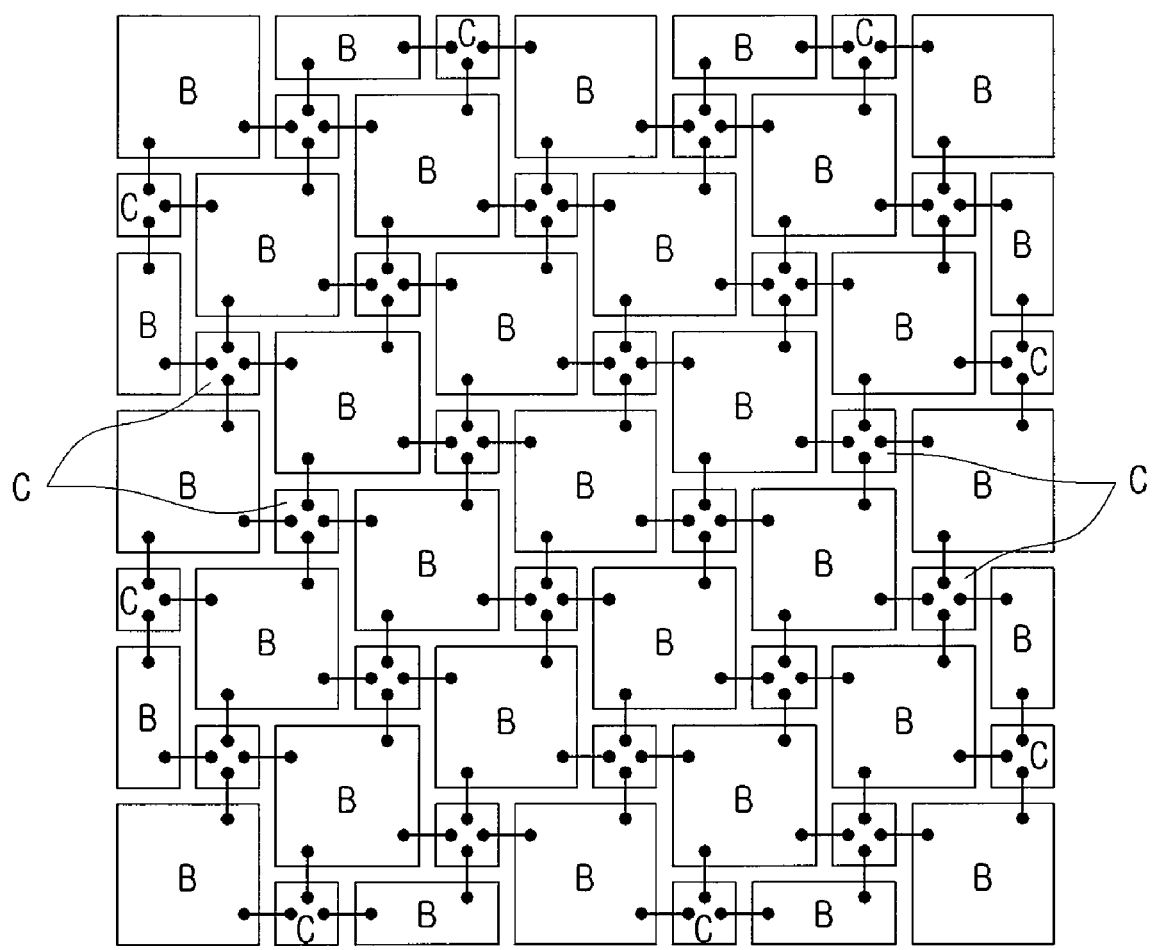
FIG. 5C and FIG. 5D are plan views showing a configuration of an electromagnetic bandgap structure including a stitching via consisting of a plurality of groups having different sized metal plates.
Figure 5D:
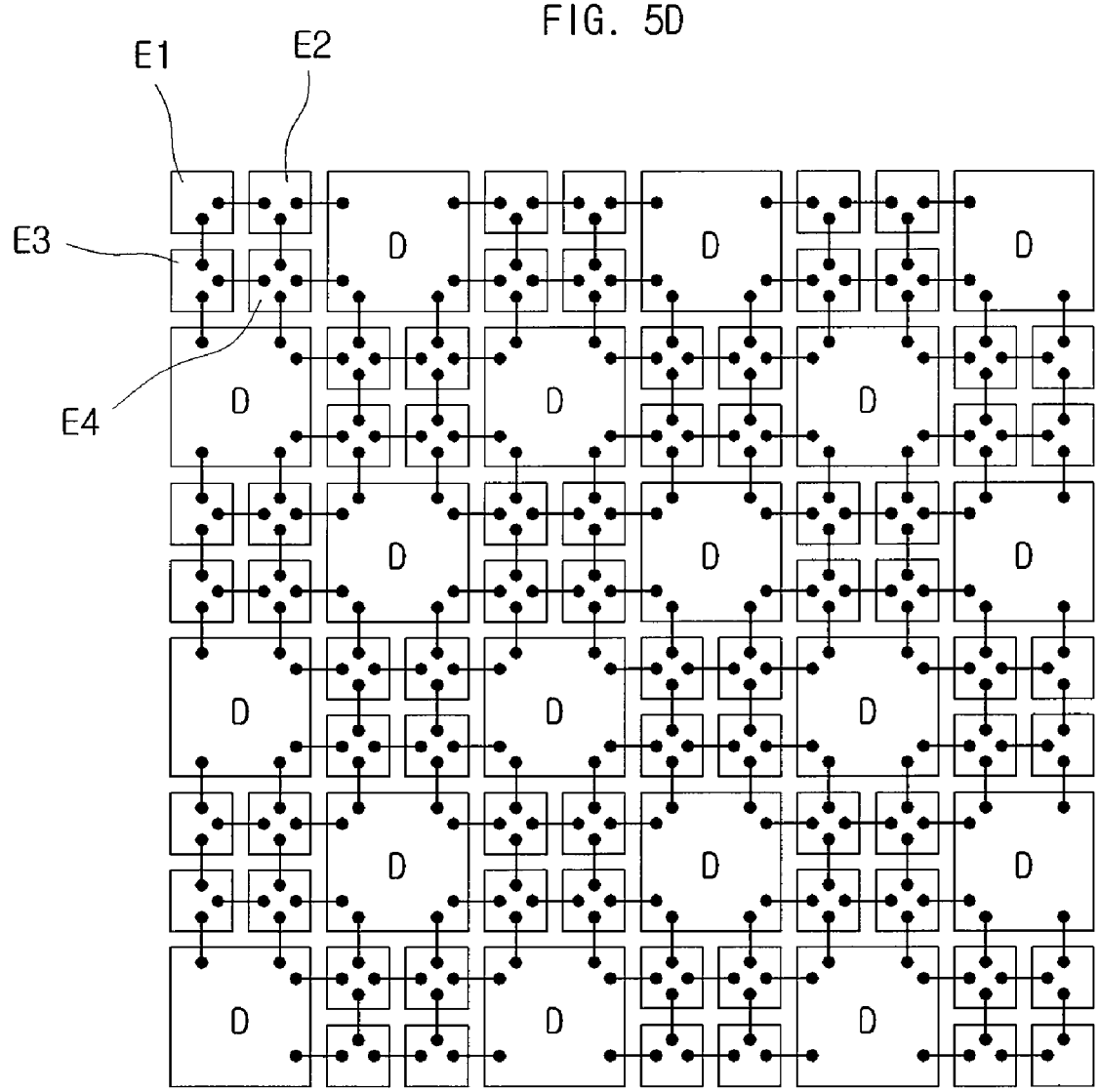
Figure 5E:
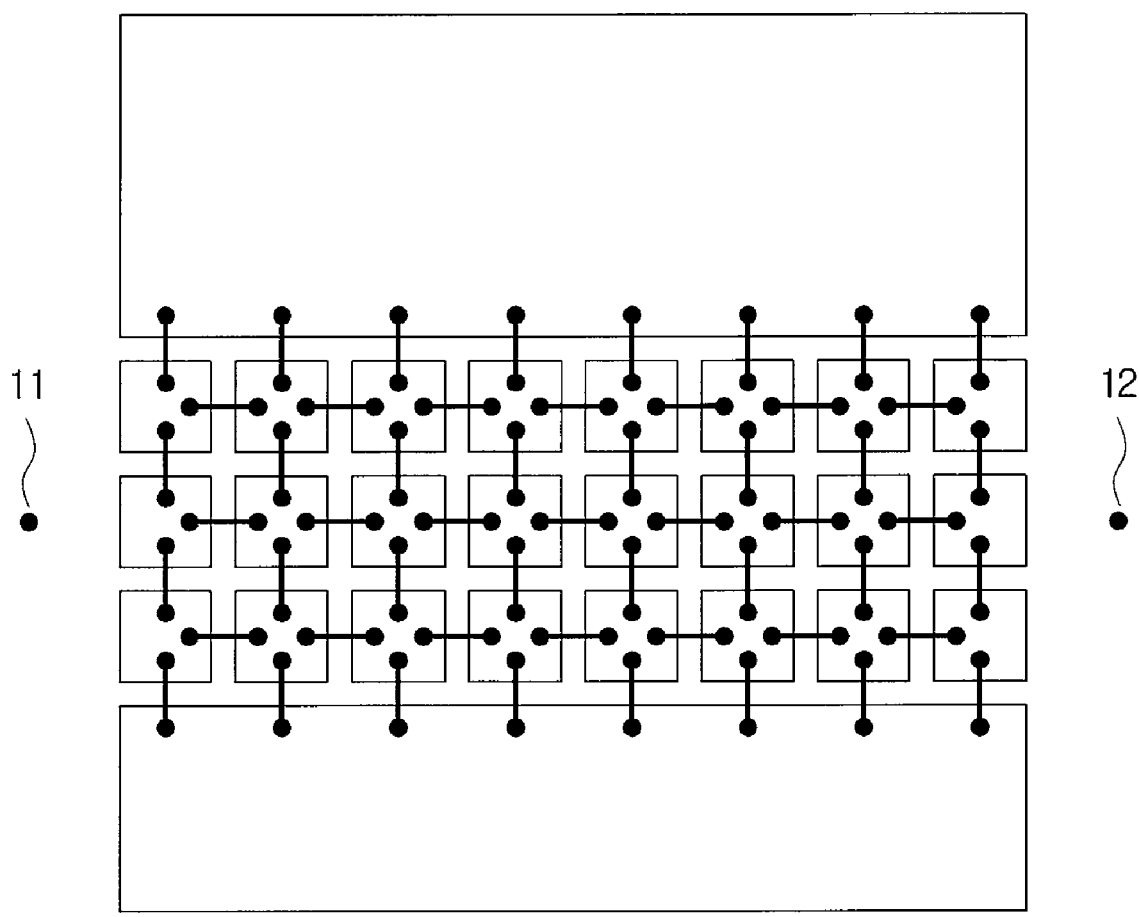
FIG. 5E is a plan view showing a band-shaped configuration of an electromagnetic bandgap structure including a stitching via.
Figure 6:
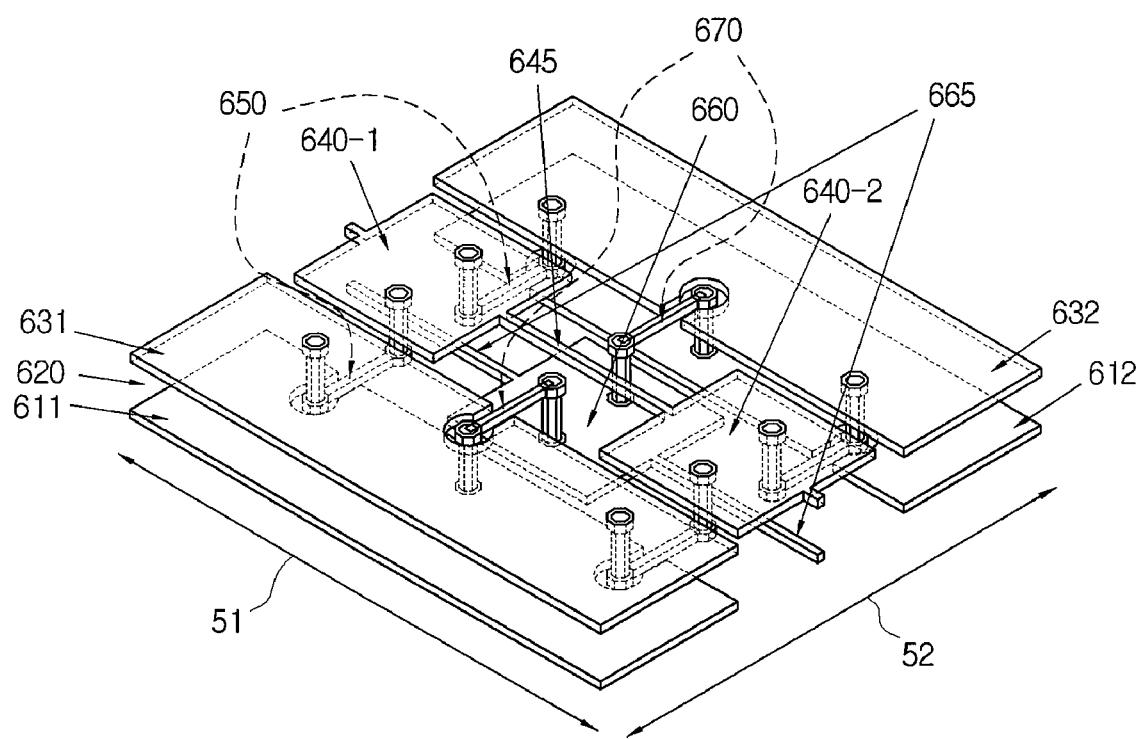
FIG. 6 is a 3-D perspective view showing an electromagnetic bandgap structure having a vertically alternating structure in accordance with an embodiment of the present invention.
Figure 7:
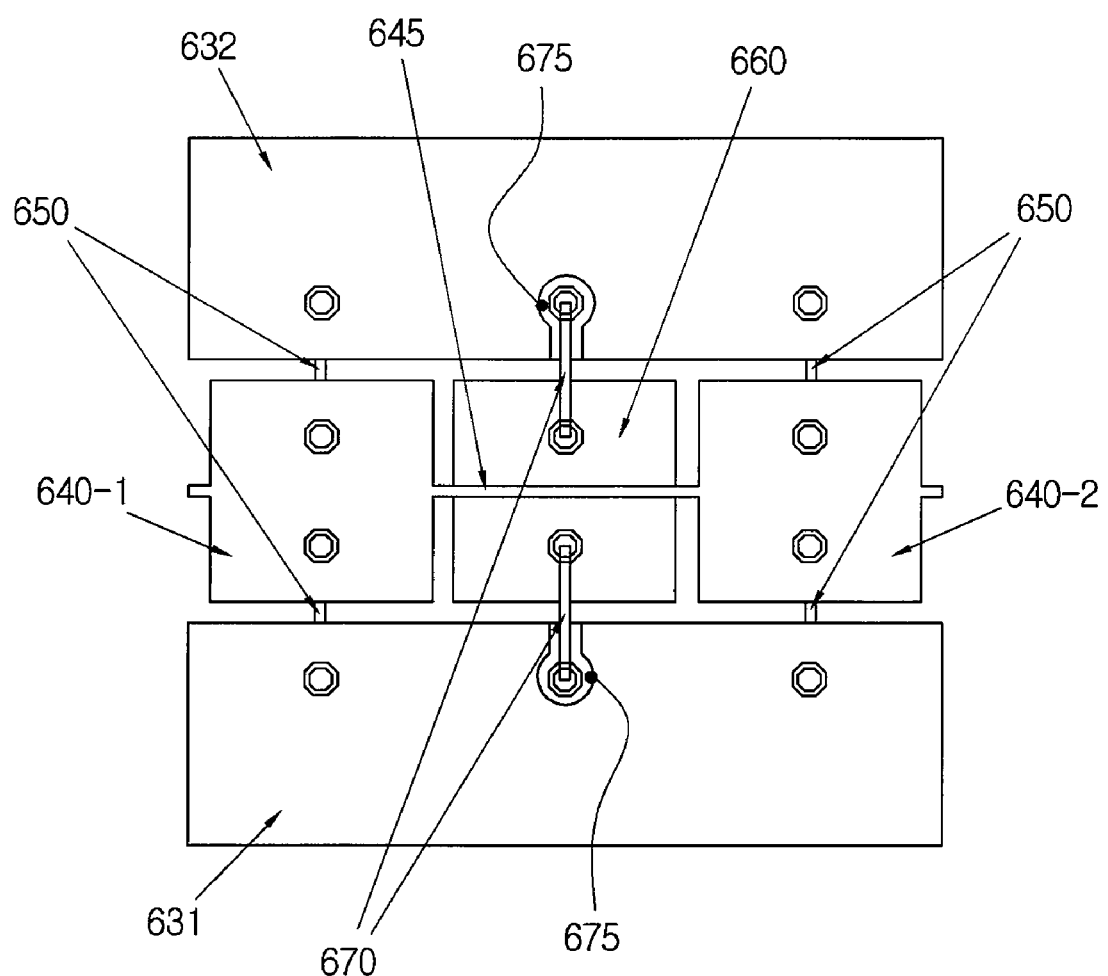
FIG. 7 is a plan view of the electromagnetic bandgap structure shown in FIG. 6 when viewed from the top.
Figure 8:
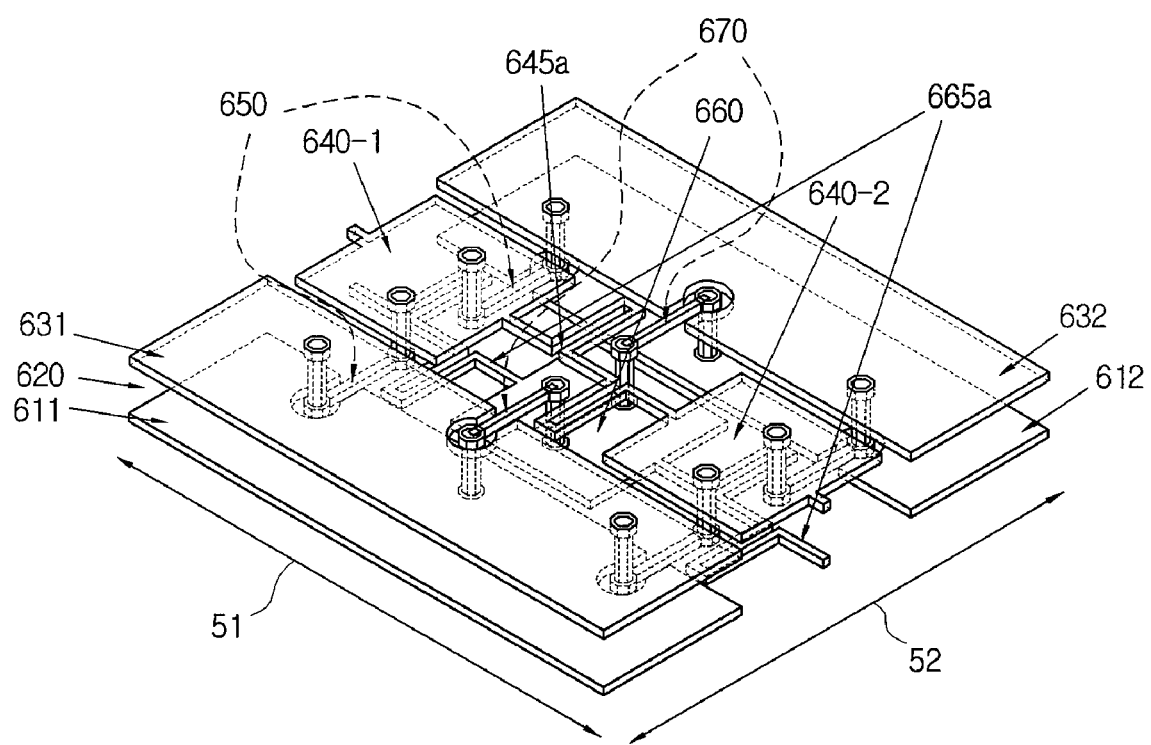
FIG. 8 is a perspective view showing a modification example of a metal trace in the electromagnetic bandgap structure shown in FIG. 6.
Figure 9:
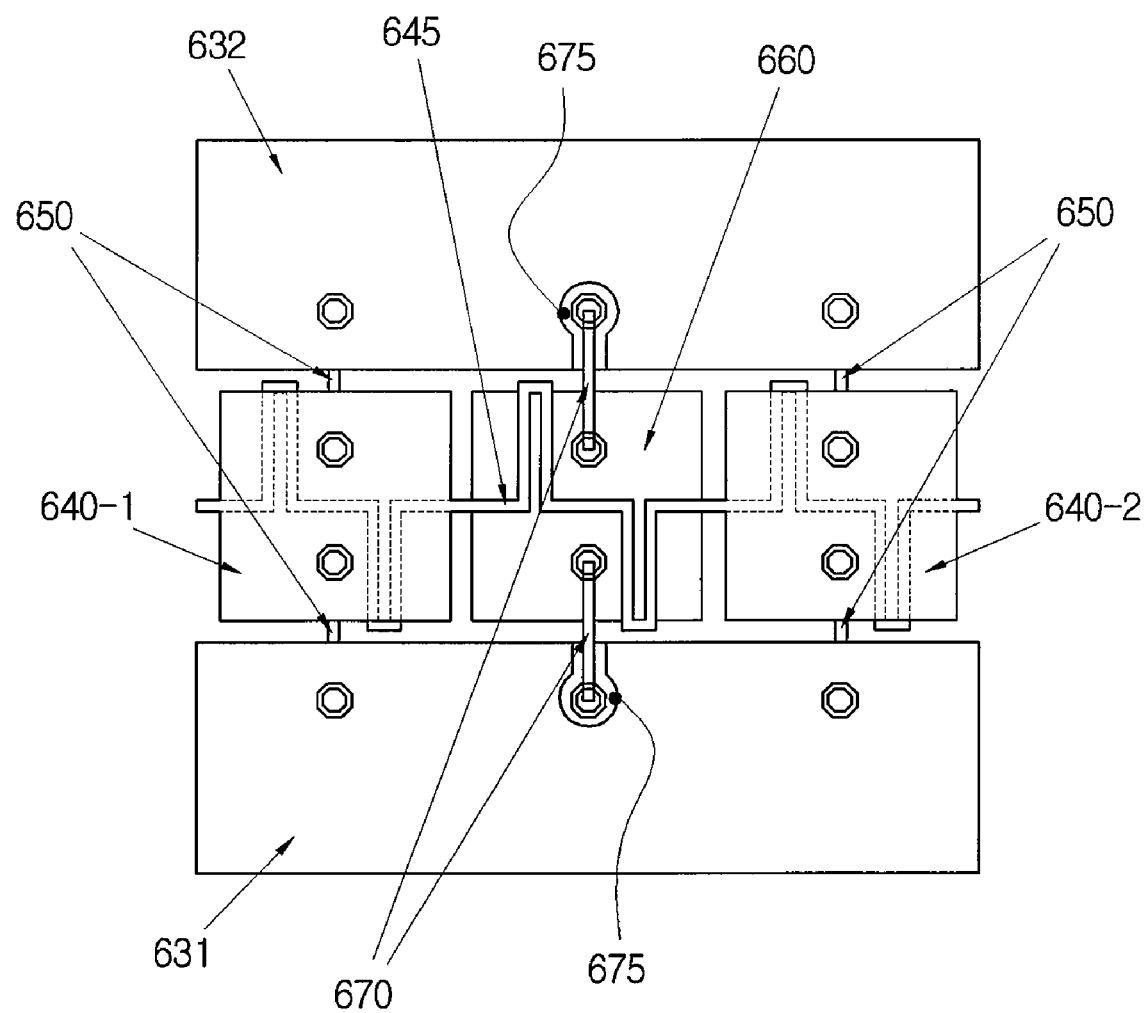
FIG. 9 is a plan view of the electromagnetic bandgap structure shown in FIG. 8 when viewed from the top.

Also, even though FIG. 4A shows each of metal plates having a square shape of the same size for the convenience of illustration, various other modifications can be possible (the same can be applied to FIG. 6 and FIG. 8). This will be briefly described with reference to FIG. 5A through FIG. 5E.

For example, the metal plates can have various polygonal shapes including not only a rectangle as shown in FIG. 5A, and a triangle as shown in FIG. 5B, but also a hexagon, an octagon, etc. Of course, the metal plate may not be limited to a certain shape such as a circle or an ellipse. Each of the metal plates can also have the same size (e.g. area and thickness) as shown in FIG. 5A, FIG. 5B and FIG. 5E. If the metal plates have different sizes, the metal plates can be distinguished and placed according to each of a plurality of groups having different sizes as shown in FIG. 5C or FIG. 5D.

In the case of FIG. 5C, metal plates B having a relatively bigger size and metal plates C having a relatively smaller size can be alternately arranged. In the case of FIG. 5D, metal plates D having a relatively bigger size and metal plates E1, E2, E3 and E4 having a relatively smaller size can be arranged. The small metal plates E1, E2, E3 and E4 can be grouped in a 2×2 form, and can occupy the area similar to the large metal plate D.

In addition, while the cells of the electromagnetic bandgap structures can be densely arranged on the whole part of an inner surface of the printed circuit board as shown in FIGS. 5A through 5D, the cells can be naturally arranged on some paths as shown in FIG. 5E. For example, as shown in FIG. 5E, if it is assumed that a point 11 refers to a noise source point and a point 12 refers to a noise blocking destination point, the cells can be repeatedly arranged in at least one line along a noise transferable path between the noise source point 11 and the noise blocking destination point 12. Alternatively, as shown in FIG. 5E, if it is assumed that a point 21 refers to the noise source point and a point 22 refers to the noise blocking destination point, the cells can be arranged in at least one line to have the shape crossing and blocking a noise transferable path between the noise source point 21 and the noise blocking destination point 22 (i.e. the shape of being shielded by a blocking shield).

Figure 1:
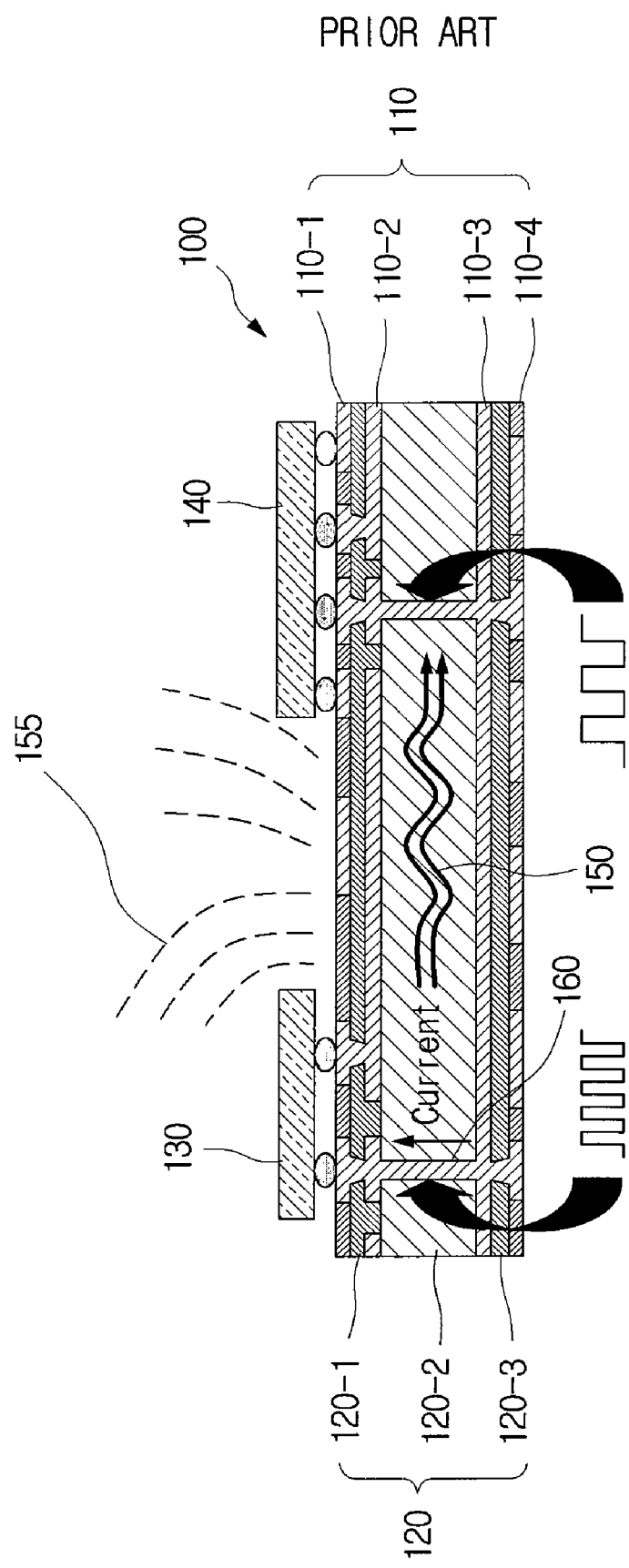
FIG. 1 is a cross-sectional view showing a printed circuit board including two electronic circuits having different operation frequencies.
Figure 2:
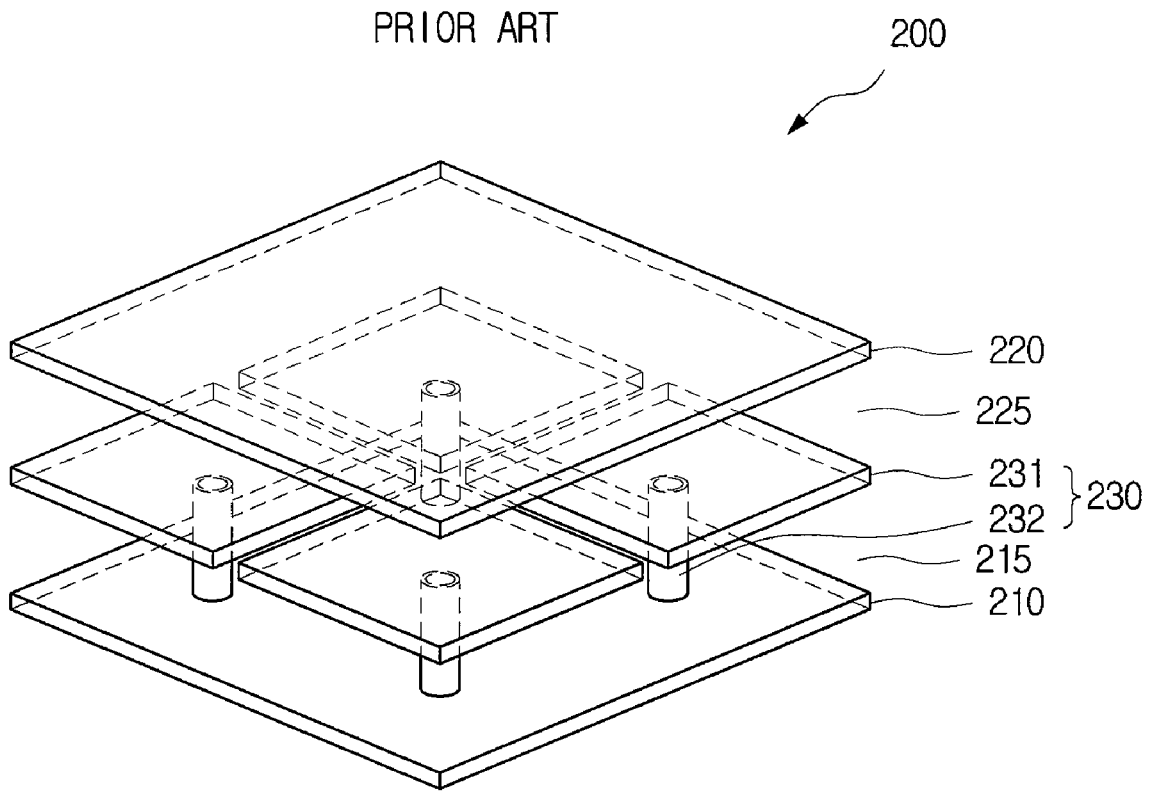
FIG. 2 is a schematic view showing an MT-EBG structure as an electromagnetic bandgap structure in accordance with a conventional art.
Figure 3:
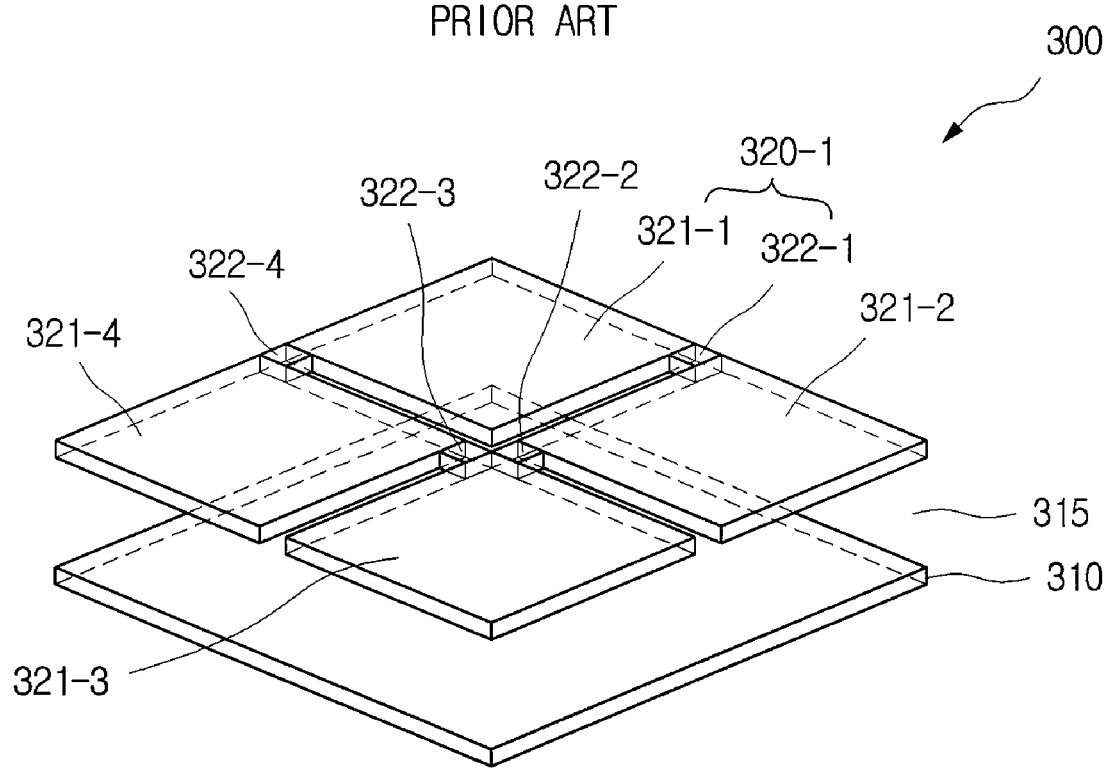
FIG. 3 is a schematic view showing a PT-EBG structure as another example of an electromagnetic bandgap structure in accordance with a conventional art.

Here, if it is assumed that any two electric circuits having different operation frequencies (refer to the first electric circuit 130 and the second electric circuit 140 in FIG. 1, described above) are implemented in the printed circuit board, the noise source point and the noise blocking destination point can correspond to each position in which the two electric circuits will be implemented.

A stitching via can electrically connect any two metal plates of a plurality of metal plates to each other. All accompanying drawings of this specification show that the stitching via electrically connects two adjacent metal plates to each other. However, it may be unnecessary that any two metal plates connected by the stitching via are adjacent to each other. Also, even though it is shown that one metal plate is connected to another metal plate by one stitching via, it is evidently unnecessary that the electromagnetic bandgap structure has any limitation to the number of the stitching vias connecting any two metal plates. However, all below descriptions focus on the case that two adjacent metal plates are connected to each other by one stitching via.

The stitching via 440 can be formed to include a first via 441, a second via 442 and a connection pattern 443 in order to electrically connect two adjacent metal plates.

Herein, the first via 441 can be formed to start from one end part 441a connected to the first metal plate 430-1 and penetrate the dielectric layer 420, and the second via 442 can be formed to start from one end part 442a connected to the second metal plate 430-2 and penetrate the dielectric layer 420. The connection pattern 443 can be placed on the same planar surface as the metal layer 410 and have one end part, connected to the other end part 441b of the first via 441, and the other end part, connected to the other end part 442b of the second via 442. At this time, it is evident that a via land having a larger size than the via can be formed at one end part and the other end part of each via in order to reduce a position error of a drilling process for forming the via. Accordingly, the pertinent detailed description will be omitted.

At this time, a clearance hole 450 can be formed at an edge of the connection pattern 443 of the stitching via 440 in order to prevent the metal plates 430-1 and 430-2 to be electrically connected to the metal layer 410.

The two adjacent metals 430-1 and 430-2 may not be connected on the same planar surface in the electromagnetic bandgap structure of FIG. 4A. Instead, the two adjacent metals 430-1 and 430-2 can be connected to each other through another planar surface (i.e. the same planar surface as the metal layer 410) by the stitching via 440. Accordingly, the electromagnetic bandgap structure 400 having the stitching via 440 of FIG. 4A can more easily acquire an inductance component with a longer length than that of connecting the adjacent metal plates to each other on the same planar surface under the same conditions. In addition, since the adjacent metal plates of the present invention are connected to each other by the stitching via 440, it is unnecessary to form an additional pattern for electrically connecting the metal plates placed on a second layer. This can make a spaced distance between the metal plates narrower. Accordingly, it can be possible to increase the capacitance component formed between the adjacent metal plates.

Described below is the principle by which the structure shown in FIG. 4A can function as the electromagnetic bandgap structure blocking a signal of a certain frequency band. The dielectric layer 420 can be interposed between the metal layer 410 and the metal plates 430-1 and 430-2. This may cause a capacitance component to be formed between the metal layer 410 and the metal plates 430-1 and 430-2 and between the two adjacent metal plates. Also, there may be an inductance component connecting through the first via 441→the connection pattern 443→the second via 442 between the two adjacent metal plates by the stitching via 440. At this time, the value of the capacitance component can vary according to various factors such as the spaced distances between the metal layer 410 and the metal plates 430-1 and 430-2 and between the two adjacent metal plates, the dielectric constant of a dielectric material forming the dielectric layer 420 and the size, shape and area of the metal plate. Also, the value of the inductance component can vary according to various factors such as the shape, length, depth, width and area of the first via 441, a second via 442 and the connection pattern 443. Accordingly, adjusting and designing various aforementioned factors adequately can make it possible to allow the structure of FIG. 4A to function as the electromagnetic bandgap structure (i.e. a band stop filter) for removing or blocking a certain noise or a certain signal of an object frequency band. This can be easily understood through the equivalent circuit of FIG. 4B.

Figure 4B:
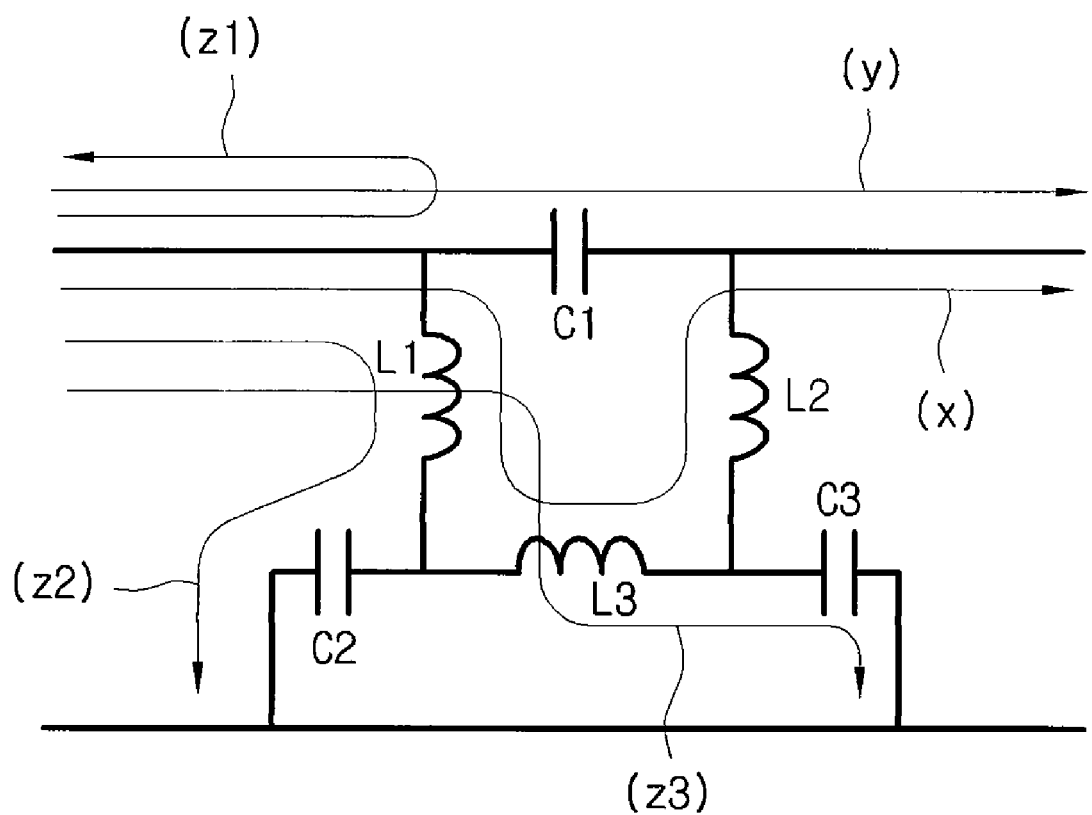
FIG. 4B is a schematic view showing an equivalent circuit of the electromagnetic bandgap structure shown in FIG. 4A.

Comparing the equivalent circuit of FIG. 4B with the electromagnetic bandgap structure of FIG. 4A, an inductance component L1 can correspond to the first via 441, and an inductance component L2 can correspond to the second via 442. An inductance component L3 can correspond to the connection pattern 443. C1 can be a capacitance component by the metal plates 430-1 and 430-2 and another dielectric layer and another metal layer to be placed above the metal plates 430-1 and 430-2. C2 and C3 can be capacitance components by the metal layer 410 placed on the same planar surface as the connection pattern 443 and another dielectric layer and another metal layer to be placed below the planar surface of the connection pattern 443.

The electromagnetic bandgap structure shown in FIG. 4A can function as a band stop filter, which blocks a signal of a certain frequency band according to the above equivalent circuit. In other words, as seen in the equivalent circuit of FIG. 4B, a signal x of a low frequency band (refer to FIG. 4B) and a signal y of a high frequency band (refer to FIG. 4B) can pass through the electromagnetic bandgap structure, and signals z1, z2 and z3 of a certain frequency band (refer to FIG. 4B) ranging between the low frequency band and the high frequency band are blocked by the electromagnetic bandgap structure.

Accordingly, if the structure of FIG. 4A is repeatedly arranged on a whole part (refer to FIG. 5A. FIG. 5B, FIG. 5C and FIG. 5D) or a part (refer to FIG. 5E) of an inner surface of the printed circuit board (the same can be applied to the structure of FIG. 6 and FIG. 8 in accordance with an embodiment of the present invention described below) as a noise transferable path, it is possible to function as the electromagnetic bandgap structure that can prevent a signal of a certain frequency band from being transferred.

Hereinafter, the electromagnetic bandgap structure in accordance with an embodiment of the present invention will be described with reference to FIG. 6 through FIG. 9. Below descriptions focus on the difference from the aforementioned electromagnetic bandgap structure, and the description of the content that can be duplicated or be equally applied as described above as shown in FIG. 4A through FIG. 5E (for example, the method of arranging the metal plates, the position of disposition, the method of connection, the detailed configuration of the stitching via, etc.) will be omitted.

The present invention presents an electromagnetic bandgap structure in which metal plates are vertically arranged alternately at the top and the bottom respectively. For the purpose of this, as illustrated in FIGS. 6 to 9, the electromagnetic bandgap structure in accordance with an embodiment of the present invention can include first metal plates 640-1 and 640-2, a second metal plate 660, a first metal trace 645 or 645a, a second metal trace 665 or 665a, a first stitching via 650 and a second stitching via 670. Moreover, a dielectric layer 620 is arranged between the first metal plate and the second metal plate. Each of the elements will be described hereinafter.

The first metal plates 640-1 and 640-2 can be placed on a planar surface inside the printed circuit board. For the convenience of description, the planar surface on which the first metal plates are placed will hereinafter be cited as a first planar surface. Although FIG. 6 through FIG. 9 show only two first metal plates 640-1 and 640-2 for the convenience of illustration, the electromagnetic bandgap structure of the present invention can have more than two first metal plates as shown in FIG. 5A through FIG. 5D. Also, even though the first metal plates 640-1 and 640-2 are arranged in a single line between metal planes 631 and 632 as shown in FIG. 6 through FIG. 9, it shall be evident that first metal plates can be arranged in two or more lines as shown in FIG. 5E.

In this case, any two adjacent metal plates being placed parallel to a first direction (refer to the reference numeral 51 of FIG. 6 and FIG. 8) among the first metal plates, which are arranged on the first planar surface, are electrically connected to each other by the first metal trace 645 or 645a on the first planar surface. Here, the first metal trace connecting the two adjacent metal plates lined up in the first direction can be manufactured either in a linear form (refer to the reference numeral 645 of FIG. 6) or in a bended form having one or more bends (refer to the reference numeral 645a of FIG. 8), as a method of improving the inductance component more effectively.

Then, any two adjacent conductive portions, which are placed parallel to a direction (refer to the reference numeral 52 in FIGS. 6 and 8, hereinafter, referred to as a second direction) that is different from the first direction 51 on the first planar surface, are electrically connected to each other by the first stitching via 650 that goes through a planar surface that is different from the first planar surface. Here, the conductive portions include the first metal plates 640-1 and 640-2 and the metal planes 631 and 632.

Since the first metal plates 640-1 and 640-2 are arranged in a single line between the two metal planes 631 and 632 placed on the first planar surface as shown in FIG. 6 through FIG. 9, each of the first metal plates 640-1 and 640-2 is connected to either of the two adjacent metal planes 631 and 632 through the first stitching via 650. However, if the first metal plates 640-1 and 640-2 are arranged in two or more lines in the first direction 51, any two adjacent first metal plates in the second direction 52 can be also connected by the first stitching via 650.

As such, the following structural differences exist between the electromagnetic bandgap structure according to an embodiment of the present invention and the previously described electromagnetic bandgap structure of FIG. 4A.

In the case of the electromagnetic bandgap structure of FIG. 4A, any one metal plate is electrically connected to the adjacent metal plates surrounding the metal plate through a stitching via.

On the other hand, in the case of the electromagnetic bandgap structure of the present invention, two adjacent metal plates around one metal plate in the first direction are electrically connected to each other through a metal trace. Likewise, two adjacent metal plates around one metal plate in a direction that is different from the first direction, or one metal plate and its adjacent metal plane, are electrically connected to each other through a stitching via. That is, a metal trace in the present invention is substituted for a portion of the stitching vias 440 connecting metal plates in all directions for the electromagnetic bandgap structure of FIG. 4. This is because both the stitching via and the metal trance can function equivalently as the inductance component.

Comparing the advantages and disadvantages of the two electromagnetic bandgap structures, which are based on their structural characteristics, may have little meaning. This is because selection between them may depend on the design conditions and the distinctiveness of each application product. Nevertheless, when comparing the two electromagnetic bandgap structures, they have the following differences.

By comparison with the structure of the present invention, the structure of FIG. 4A has a number of stitching vias being connected to one metal plate, and thus there may a design limit in reducing the size of the metal plate into a certain size due to the area occupied by the stitching vias. Due to the same reason described above, the length of the pattern being obtained through the stitching vias can be also limited. By contrast, the structure of the present invention has less design limitations because metal plates in a certain direction are connected to each other through a metal trace. Moreover, the length of the pattern being obtained can be also increased by variously forming the shape of production, for example, forming the metal trace in the shape of curved line.

However, the present invention still has some problems, in which the capacitance component being formed between the metal plates is reduced, or the number of the metal plates being disposed inside the same area is decreased, since each distance between the metal plates connected through a metal trace in the first direction is longer than that of the structure of FIG. 4A. Nevertheless, such problems can be solved by another structural characteristic of the present invention, in which additional metal plates are added and then vertically arranged alternately at the top and the bottom respectively.

As it can be seen through FIG. 6 and FIG. 8, the electromagnetic bandgap structure of the present invention has not only the first metal plates 640-1 and 640-2 on the first planar surface but also the second metal plate on a planar surface (hereinafter, referred to as a second planar surface) that is different from the first planar surface. Although FIG. 6 and FIG. 8 show only one second metal plate 650 for the convenience of illustration, the electromagnetic bandgap structure can have a plurality of second metal plates being disposed on the second planar surface, as described above.

The plurality of second metal plates are arranged at a particular area of the second planar surface corresponding to the area in which the plurality of first metal plates are arranged, and the plurality of second metal plates and the plurality of first metal plates are alternately formed at the top and the bottom respectively.

In this case, as described above, any two adjacent second metal plates in the first direction 51 are electrically connected to each other by the second metal trace 665, and any two adjacent conductive portions in the second direction 52 are electrically connected to each other by the second stitching via 670. Here, as described above, the conductive portions being connected by the second stitching via 670 include not only the second metal plate but also two metal planes 611 and 612. The second metal trace can be shaped either in a linear form (refer to the reference numeral 665 of FIG. 6) or in a bended form having one or more bends (refer to the reference numeral 665a of FIG. 8).

When the first metal plates and the second metal plates are viewed from the top as illustrated in FIG. 6 through FIG. 9, they can be arranged alternately at the top and the bottom respectively, such that the first metal plates and the second metal plates do not overlap with one another. In this case, there is an advantage of increasing the length of the metal trace that may be obtainable. However, unlike the alternating structure described above, another vertically alternating structure (that is, a structure having overlaps) can also be implemented.

Moreover, each of the first metal plates and the second metal plates functions as a different electric signal layer. For example, if the first metal plate is electrically connected to one of a ground layer and a power layer, the second metal plate can be electrically connected to the other, and if the first metal plate is electrically connected to one of the ground layer and a signal layer, the second metal plate can be electrically connected to the other. That is, unlike the structure of FIG. 4A, the present invention has metal plates arranged on both top and bottom layers, in which the metal plates on the top layer and the bottom layer are electrically separated from each other.

Due to the reason described above, if the first stitching via 650 passes through the metal planes 611 and 612 that are electrically connected to the second metal plates, a clearance hole can be formed on the metal planes 611 and 612 such that the first stitching via 650 and the metal planes 611 and 612 are not electrically connected to one another. The same can be applied, if the second stitching via 670 passes through the metal planes 631 and 632 that are electrically connected to the first metal plates, a clearance hole can be formed on the metal planes 631 and 632 such that the second stitching via 670 and the metal planes 631 and 632 are not electrically connected to one another (refer to the reference numeral 675 of FIG. 7 and FIG. 9).

As described above, the electromagnetic bandgap structure of the present invention has a vertically alternating structure, in which the first metal plates and the second metal plates are placed on different planar surfaces and alternately formed at the top and the bottom respectively. The present invention solves the conductive noise problem through the vertically alternating structure described above.

If it is assumed that one of the two metal planes 631 and 632, which are separated from each other by a portion in which the first metal plates are placed on the first planar surface, corresponds to the noise source point on the printed circuit board and the other corresponds to the noise blocking destination point (the same can be applied to another set of the two metal planes 611 and 612 being separated from each other by a portion in which the second metal plates are placed), a conductive noise being transferred along a path between the noise source point and the noise blocking destination point can be shielded by the electromagnetic bandgap structure having the vertically alternating structure interposed between them.

In connection with the conductive noise blocking effect, connecting the metal plates by the stitching via through different planar surfaces is far superior to connecting the metal plates by the metal trace on a same planar surface. Therefore, it may be preferred that the first stitching via 650 and the second stitching via 670 are formed facing the second direction 52 (i.e., the same as the direction of noise) of FIG. 6 and FIG. 8, and the first metal trace 645 and the second metal trace 665 are formed facing the first direction 51 (i.e., a direction crossing the noise transferable path between the noise source point and the noise blocking destination point). Moreover, it shall be apparent that an opposite of the method described above or another connecting method can be employed.

Figure 10:
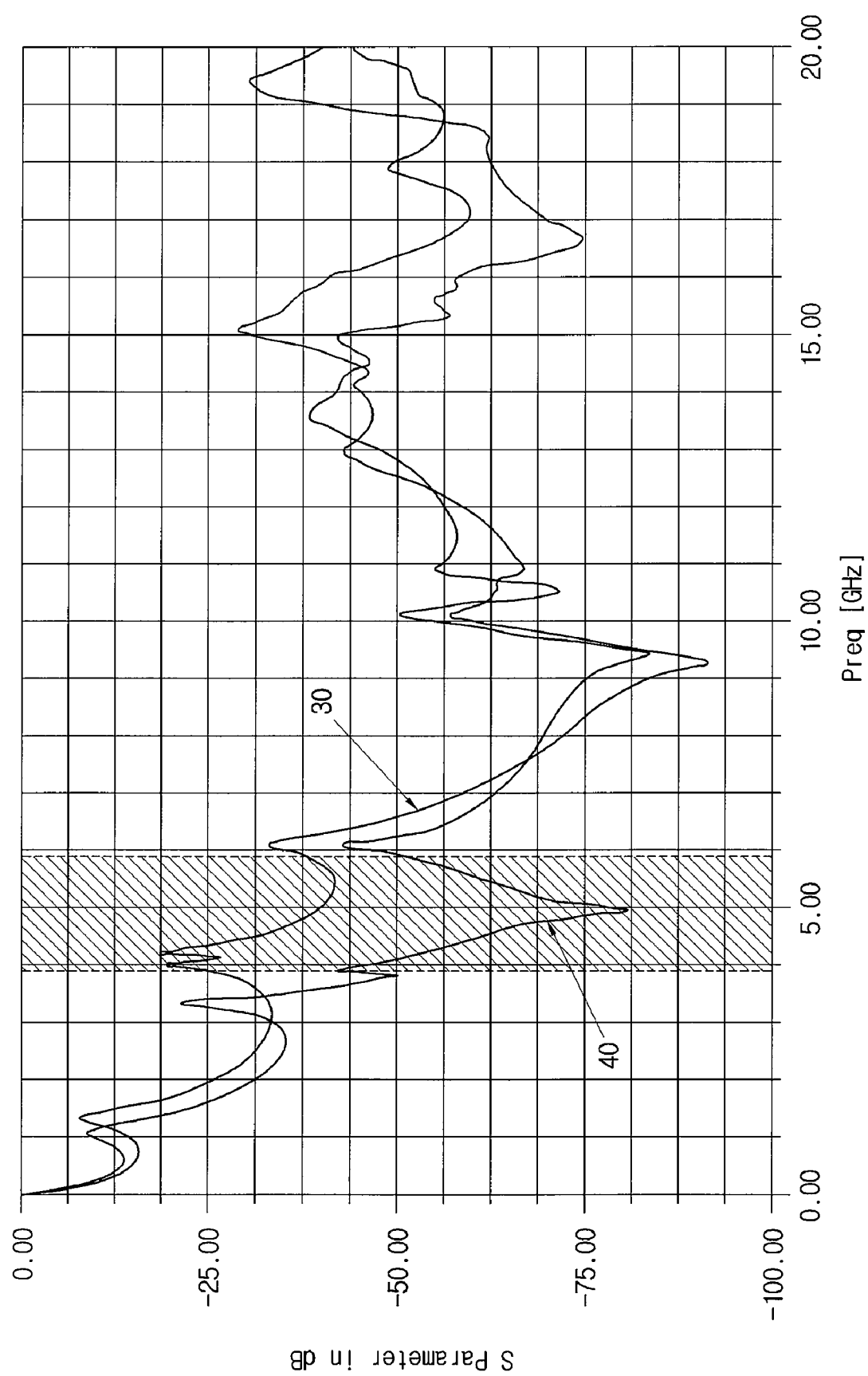
FIG. 10 is a graph showing a comparison of a bandgap frequency property of the electromagnetic bandgap structures shown in FIG. 4A and FIG. 6.

FIG. 10 shows a simulation result that is analyzed by scattering parameters in order to check whether an electromagnetic bandgap structure including the vertically alternating structure provided by the present invention has the band blocking property of a certain frequency band.

Here, the reference numeral 30 indicates the frequency property of the electromagnetic bandgap structure including the stitching via 440 as illustrated in FIG. 4A, and the reference numeral 40 indicates the frequency property of the electromagnetic bandgap structure having the vertically alternating structure as illustrated in FIG. 6.

With reference to FIG. 10, while the electromagnetic bandgap structure of FIG. 4A has the bandgap frequency band formed from at least 6.5 GHz on a blocking rate of −50 dB basis, it can be recognized that the electromagnetic bandgap structure shown in FIG. 6 has the bandgap frequency band formed from about 4 GHz on the same blocking rate (i.e. −50 dB) basis and the same design condition (i.e. the same metal plate size, same via length, same dielectric material, etc.). In other words, it can be seen that the electromagnetic bandgap structure shown in FIG. 6 has the bandgap frequency band lowered by about 2.5 GHz as compared with the electromagnetic bandgap structure of FIG. 4A. That is, due to the vertically alternating structure, even though the number of the metal plates and the vias remained the same as those of the electromagnetic bandgap structure of FIG. 4A, the electromagnetic bandgap structure of the present invention could acquire larger inductance components by the metal traces.

While the spirit of the invention has been described in detail with reference to particular embodiments, the embodiments are for illustrative purposes only and shall not limit the invention. It is to be appreciated that those skilled in the art can change or modify the embodiments without departing from the scope and spirit of the invention. As such, many embodiments other than those set forth above can be found in the appended claims.

What is claimed is:

1. An electromagnetic bandgap structure comprising:
   a plurality of first conductive plates, placed on a first planar surface;
   a plurality of second conductive plates, placed on a second planar surface;
   a first conductive trace, configured to electrically connect any two adjacent first conductive plates with each other on the first planar surface, the two adjacent first conductive plates lined up in a first direction among the plurality of first conductive plates;
   a second conductive trace, configured to electrically connect any two adjacent second conductive plates with each other on the second planar surface, the two adjacent second conductive plates lined up in the first direction among the plurality of second conductive plates;
   a first stitching via, configured to electrically connect any two adjacent conductive portions with each other, the two adjacent conductive portions lined up in a direction that is different from the first direction on the first planar surface by having a part of the first stitching via pass through a planar surface that is different from the first planar surface, wherein the two adjacent conductive portions placed on the first planar surface include at least one of the plurality of first conductive plates; and
   a second stitching via, configured to electrically connect any two adjacent conductive portions with each other, the two adjacent conductive portions lined up in a direction that is different from the first direction on the second planar surface by having a part of the second stitching via pass through a planar surface that is different from the second planar surface, wherein the two adjacent conductive portions placed on the second planar surface include at least one of the plurality of second conductive plates.

2. The electromagnetic bandgap structure of claim 1, wherein a dielectric layer is interposed between the first conductive plates and the second conductive plates.

3. The electromagnetic bandgap structure of claim 1, wherein the planar surface through which the part of the first stitching via passes is the second planar surface.

4. The electromagnetic bandgap structure of claim 1, wherein the first stitching via comprises:
   a first via, having an end part being connected to one of the two adjacent conductive portions placed on the first planar surface;
   a second via, having an end part being connected to the other of the two adjacent conductive portions placed on the first planar surface; and
   a connection pattern, having one end part being connected to the other end part of the first via and the other end part being connected to the other end part of the second via, the connection pattern being placed on the planar surface that is different from the first planar surface.

5. The electromagnet bandgap structure of claim 1, wherein the other planar surface through which the part of the second stitching via passes is the first planar surface.

6. The electromagnetic bandgap structure of claim 1, wherein the second stitching via comprises:
   a first via, having an end part being connected to one of the two adjacent conductive portions placed on the second planar surface;
   a second via, having an end part being connected to the other of the two adjacent conductive portions placed on the second planar surface; and
   a connection pattern, having one end part being connected to the other end part of the first via and the other end part being connected to the other end part of the second via, the connection pattern being placed on the planar surface that is different from the second planar surface.

7. The electromagnetic bandgap structure of claim 1, wherein the first conductive trace is in a linear form or in a bended form having one or more bends.

8. The electromagnetic bandgap structure of claim 1, wherein the second conductive trace is in a linear form or in a bended form having one or more bends.

9. The electromagnetic bandgap structure of claim 1, wherein the second conductive plates are disposed on the second planar surface at an area that corresponds to an area on which the first conductive plates are disposed, whereas the first conductive plates and the second conductive plates are disposed alternately on the first planar surface and the second planar surface, respectively, in such a way that the first conductive plates and the second conductive plates are not overlapped when viewed from the top.

10. The electromagnetic bandgap structure of claim 1, wherein:
    the first stitching via connects any two conductive portions located adjacent each other on the first planar surface in a direction that is perpendicular to an extension direction of the first conductive trace, and
    the second stitching via connects any two conductive portions located adjacent each other on the second planar surface in a direction that is perpendicular to the first an extension direction of the second conductive trace.

11. A printed circuit board in which an electromagnetic bandgap structure is disposed in an area of a noise transferable path between a noise source point and a noise blocking destination point of the printed circuit board, the electromagnetic bandgap structure comprising:
    a plurality of first conductive plates, placed on a first planar surface;
    a plurality of second conductive plates, placed on a second planar surface;
    a first conductive trace, configured to electrically connect any two adjacent first conductive plates with each other on the first planar surface, the two adjacent first conductive plates lined up in a first direction among the plurality of first conductive plates;
    a second conductive trace, configured to electrically connect any two adjacent second conductive plates with each other on the second planar surface, the two adjacent second conductive plates lined up in the first direction among the plurality of second conductive plates;
    a first stitching via, configured to electrically connect any two adjacent conductive portions with each other, the two adjacent conductive portions lined up in a direction that is different from the first direction on the first planar surface by having a part of the first stitching via pass through a planar surface that is different from the first planar surface, wherein the two adjacent conductive portions placed on the first planar surface include at least one of the plurality of first conductive plates; and
    a second stitching via, configured to electrically connect any two adjacent conductive portions with each other, the two adjacent conductive portions lined up in a direction that is different from the first direction on the second planar surface by having a part of the second stitching via pass through a planar surface that is different from the second planar surface, wherein the two adjacent conductive portions placed on the second planar surface include at least one of the plurality of second conductive plates.

12. The printed circuit board of claim 11, wherein at least one of the first conductive trace and the second conductive trace is in a linear form or in a bended form having one or more bends.

13. The printed circuit board of claim 11, wherein the second conductive plates are disposed on the second planar surface at an area that corresponds to an area on which the first conductive plates are disposed, whereas the first conductive plates and the second conductive plates are disposed alternately on the first planar surface and the second planar surface, respectively, in such a way that the first conductive plates and the second conductive plates are not overlapped when viewed from the top.

14. The printed circuit board of claim 11, wherein the first conductive plates are disposed in an extension direction of the first conductive trace in at least one line, and the second conductive plates are disposed in an extension direction of the second conductive trace in at least one line.

15. The printed circuit board of claim 14, wherein the first stitching via or the second stitching via connects the two conductive portions with each other in a direction that is perpendicular to the first direction.

16. The printed circuit board of claim 11, wherein the first conductive plates are electrically connected to one of a ground layer and a power layer, and the second conductive plates are electrically connected to the other of the ground layer and the power layer.

17. The printed circuit board of claim 11, wherein the first conductive plates are electrically connected to one of a ground layer and a signal layer, and the second conductive plates are electrically connected to the other of the ground layer and the signal layer.

18. The printed circuit board of claim 11, further comprising a pair of conductive planes, separated by a portion in which the first conductive plates are disposed on the first planar surface,
wherein the conductive planes and the first conductive plates adjacent to the conductive planes are electrically connected to each other by the first stitching via, whereas the two conductive planes correspond to the noise source point and the noise blocking destination point, respectively.

19. The printed circuit board of claim 11, further comprising a pair of conductive planes, separated by a portion in which the second conductive plates are disposed on the second planar surface,
wherein the conductive planes and the second conductive plates adjacent to the conductive planes are electrically connected to each other by the second stitching via, whereas the two conductive planes correspond to the noise source point and the noise blocking destination point, respectively.

20. The printed circuit board of claim 11, wherein, two electronic circuits having different operation frequencies are installed in the printed circuit board and, the noise source point and the noise blocking destination point correspond to one position and the other position, respectively, on the printed circuit board in which the two electric circuits are to be installed.

* * * * *